US006056189A

United States Patent [19]

Gao et al.

[11] Patent Number: 6,056,189

[45] Date of Patent: May 2, 2000

[54] FLUXING MEDIA FOR NON-VOC, NO-CLEAN SOLDERING

[75] Inventors: Guilian Gao, Novi; Lakhi Nandlal Goenka, Ann Arbor, both of Mich.

[73] Assignee: Ford Global Technologies, Inc., Dearborn, Mich.

[21] Appl. No.: 09/039,096

[22] Filed: Mar. 13, 1998

Related U.S. Application Data

[62] Division of application No. 08/684,757, Jul. 22, 1996, Pat. No. 5,958,151.

[51] Int. Cl.[7] .............................. B23K 1/20; B23K 31/02

[52] U.S. Cl. ............................................ 228/207; 228/223

[58] Field of Search .................................... 228/207, 223; 148/23

[56] References Cited

U.S. PATENT DOCUMENTS

| | | | |
|---|---|---|---|
| 3,235,414 | 2/1966 | Marks | 148/23 |
| 3,275,201 | 9/1966 | Tedeschi et al. | 222/102.25 |
| 4,566,916 | 1/1986 | Nagano et al. | 148/26 |
| 4,871,105 | 10/1989 | Fisher et al. | 228/33 |
| 5,013,366 | 5/1991 | Jackson et al. | 134/1 |
| 5,085,365 | 2/1992 | Turner | 228/223 |
| 5,092,943 | 3/1992 | Davis et al. | 148/23 |
| 5,145,531 | 9/1992 | Turner et al. | 148/23 |
| 5,288,332 | 2/1994 | Pustilnik et al. | 134/27 |
| 5,415,337 | 5/1995 | Hogan et al. | 228/223 |
| 5,443,660 | 8/1995 | Gao et al. | 148/24 |
| 5,447,577 | 9/1995 | Gao et al. | 148/23 |
| 5,452,840 | 9/1995 | Turner | 228/207 |
| 5,507,882 | 4/1996 | Bristol et al. | 148/23 |
| 5,632,438 | 5/1997 | Hoffmeyer et al. | 228/207 |

FOREIGN PATENT DOCUMENTS

| | | |
|---|---|---|
| 0410623 | 1/1991 | European Pat. Off. . |

OTHER PUBLICATIONS

"Ternary Systems Of Liquid Carbon Dioxide", by Alfred W. Francis, Journal of Physical Chemistry, vol. 58, Dec. 1954, pp. 1099–1100.

"Supercritical Fluids for Single Wafer Cleaning", by Edward Bok et al, , Solid State Technology, Jun. 1992, pp. 117–120.

"Supercritical Carbon Dioxide Precision Cleaning For Solvent And Waste Reduction", by W. Dale Spall, International Journal of Environmentally Conscious Design & Manufacturing, vol. 2, No. 1, 1993, pp. 81–86.

European Search Report EP–90307780.8 (Oct. 15, 1990).

*Primary Examiner*—Patrick Ryan

*Assistant Examiner*—Jeffrey T. Knapp

*Attorney, Agent, or Firm*—Joseph W. Malleck; Roger L. May

[57] ABSTRACT

A flux formulation without a surfactant is available for use in the assembly of electronic circuit boards as a no-clean formulation. The formulation includes a flux solution having a fluxing agent consisting essentially of one or more weak organic acids and a solvent consisting essentially of water. The flux solution serves to transport the fluxing agent before deposition thereof upon a soldering site for reliability improvement engendered by a lack of hygroscopic residue and for avoidance of environmental degradation engendered by a lack of volatile organic chemicals (VOC's). The method includes the steps of heating the flux solution and dispersing it as a fine spray.

9 Claims, 1 Drawing Sheet

FLUXING MEDIA FOR NON-VOC, NO-CLEAN SOLDERING

CROSS REFERENCE TO RELATED APPLICATION

This is a divisional of application Ser. No. 08/684,757, filed on Jul. 22, 1996 now U.S. Pat. No. 5,958,151.

TECHNICAL FIELD

This invention relates to fluxing media for non-volatile organic chemicals, no-clean soldering operations.

BACKGROUND ART

There are two types of widely used fluxing technology in the electronics industry: liquid spray and liquid foaming. For both techniques, to achieve a uniform deposition, the solvent in the flux must wet the electronic board to be soldered to form a continuous film. Conventionally, the volume of the solvent needed to wet a board is relatively large. But for a soldering operation having no post-soldering cleaning steps, the flux residue after the soldering must be benign and minimum in quantity. Accordingly, most no-clean fluxes usually have very high solvent content (95% to 99%) and low solid content (typically 1% to 5%).

There are basically two types of solvents in use today: volatile organic compounds (VOC) which evaporate easily during the soldering process, and water. Low solid content fluxes using alcohol or other organic compounds as solvents wet the board easily. However, they emit large amounts of VOC during the soldering process and thus create environmental problems. Low solid content water-based fluxes, on the other hand, need a surfactant to assist wetting, since water has a very high surface tension when deployed upon the electronic board and metals to be joined. The surfactant leaves a hygroscopic residue after the soldering operation and thus has to be cleaned off or the final product has to be protected with a conformal coating or an encapsulant.

The quest for better ways to clean precision electronic components without ozone-depleting solvents had led to the development of cleaning processes that reduce the need for solvents. Techniques have now emerged for using supercritical carbon dioxide instead of environmentally harmful CFC-based solvents to remove particles and organic contaminants introduced during the manufacturing of circuit boards. However, the use of a supercritical carbide dioxide may tend to adversely attack the board itself or a plastic housing which may accommodate the board. Accordingly, for these among other reasons, supercritical carbon dioxide may be a sub-optimal approach to cleaning electronic circuit boards.

U.S. Pat. No. 5,447,577 (issued to the assignee of the present application) disclosed that heating a water solution of adipic acid dramatically increases the solubility of adipic acid in water (col. 4, line 26). As a result, a uniform flux deposition can be achieved by using only a small fraction of the solvent used in conventional low-solid fluxes (col. 4, line 12). The minimal quantity of solvent can eliminate the need for a surfactant that leaves highly hygroscopic residue. Thus, post-soldering cleaning or the need for a conformal coating or an encapsulant is avoided (col. 4, line 23). Thus, the disclosure of the '577 patent focused on the use of supercritical carbon dioxide (claims 1–14) as the solvent and carrier for the flux. Claims 15–18 disclosed the use of carbon dioxide in a low pressure state as a stream separate from the flux.

SUMMARY OF INVENTION

The invention relates to a flux formulation for use in the assembly of electronic circuit boards. The formulation comprises a flux solution having a fluxing agent which consists essentially of one or more weak organic acids and a solvent consisting essentially of water. The flux solution serves to transport the fluxing agent before deposition thereof upon a soldering site for reliability improvement engendered by a lack of hygroscopic residue and for avoidance of environmental degradation engendered by a lack of VOC's.

The invention also comprises a method for delivering a flux formulation without a surfactant for use in the assembly of electronic circuit boards as a no-clean formulation. The method comprises preparing the above flux solution. The flux solution is heated to create a heated flux solution and to increase the solubility of the one or more organic acids in the solvent, thereby diminishing the proportion of solvent needed in the heated flux solution and diminishing hygroscopic residue remaining after soldering. The heated flux solution is applied through a means of dispersion so that the flux solution is dispersed as fine particles.

BEST MODE(S) FOR CARRYING OUT THE INVENTION

Figure 1:
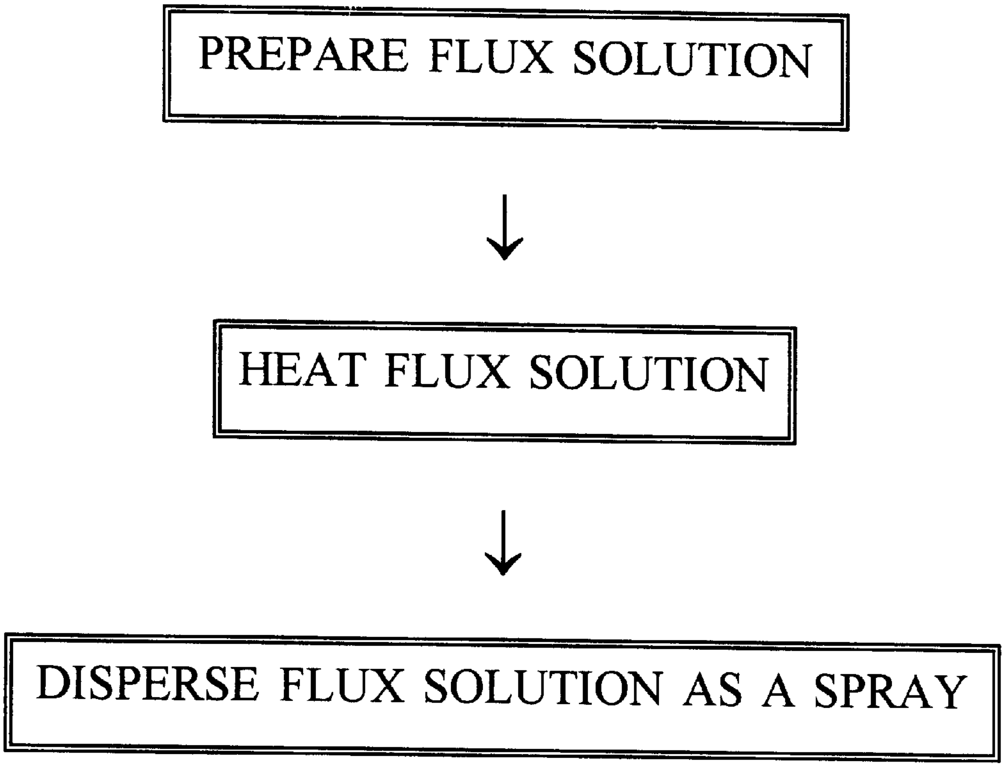
FIG. 1 is a process flow diagram illustrating the main method steps of the present invention.

The invention broadly relates to a flux formulation for use in the assembly of electronic circuit boards. The formulation includes one or more weak organic acids and a solvent consisting essentially of water. The flux solution transports the fluxing agent through a deposition thereof upon a soldering site for reliability improvement engendered by a lack of hygroscopic residue and for avoidance or environmental degradation engendered by a lack of VOC's.

The method of the present invention calls for delivering the flux formulation to an electronic circuit board having components to be joined by soldering. The method (FIG. 1) includes the following steps:

- preparing a flux solution having a fluxing agent consisting essentially of one or more weak organic acids and a solvent consisting essentially of water;
- heating the flux solution to create a heated flux solution and to increase the solubility of the one or more organic acids in the solvent, thereby diminishing the proportion of solvent needed in the heated flux solution and diminishing hygroscopic residue remaining after soldering; and
- applying the heated flux solution through a means of dispersion so that the flux solution is dispersed as fine particles.

FIG. 1 illustrates a process flow chart of the method steps used to practice the present invention.

The preferred flux is a water solution of a weak organic acid, such as adipic acid with very high solid content (up to 62.5%) contained in a closed vessel, heated to near the boiling point of water (i.e., 100° C.). Heating the water-based flux dramatically increases the solubility of the weak organic acid, such as adipic acid in water. At 25° C., 100 ml of water dissolves 1.44 g adipic acid, while at 100° C., 100 ml of water dissolves 160 g. Water-based low-solid fluxes formulated to be applied through spray or forming using today's fluxing technology typically contain less than 5% solid. Through heating, flux containing as much as 62.5% activator can be achieved. Typically, concentrations of 2–5% adipic acid in water are used.

Using a heated flux solution to dispense the flux provides distinct advantages over fluxing technologies currently used in the electronics industry because such a flux has a high solid content, yet still provides a uniform deposition. As a result, this approach requires only a small fraction of the solvent used in today's low solid fluxes to achieve a uniform deposition. This overcomes some problems associated with use of a solvent in conventional fluxes.

The method of this invention disperses the flux into very fine particles. Thus, it is not necessary for the solvent to wet the board completely in order to achieve a uniform flux deposition. Therefore, for fluxes using a VOC as a solvent, the volume of VOC emitted during soldering operations can be greatly reduced. For a water-based flux, it can eliminate the need for a surfactant which leaves hygroscopic residue, and thus eliminates post-soldering cleaning or the need for a conformal coating or an encapsulant.

To minimize ionic contamination of the board, the diluent water should be deionized or distilled. Addition of a biocide is not necessary because the temperature of the flux during the operation is high enough to kill most bacteria. For use with the present invention, the purity of water should be carefully controlled.

Other co-solvents such as alcohols, amines, and the like could be used if their concentration is limited to less than 5 volume %, subject to environmental regulations of the use of VOC's.

The disclosed fluxing agent consists essentially of one or more weak organic acids. Such acids include adipic acid, glutaric acid, succinic acid, and manolic acid. If desired, the acids can be mixed.

The step of applying the heated flux solution through a means of dispersion effectively distributes the heated flux solution at a flow rate between 5–50 ml/min as fine particles. Flux dispersion can be accomplished by a means of dispersion, such as by providing a low volume flow of metered flux to an atomizing nozzle. This can consist of a gas-assisted spray nozzle utilizing air, nitrogen, carbon-dioxide, or suitable gas for dispersion of the flux, or an ultrasonic spray nozzle which utilizes a piezo-electric driver for atomization of the flux. Other suitable atomizing nozzles such as bell and rotary atomizers could also be used. Typically, the spray droplet diameter size is about 10–400 micrometers.

Test results have shown that product reliability is improved by eliminating the surfactants commonly used in water-based fluxes. The test procedure measures leakage current passing between two sets of fingers of an inter-digitated pattern under a certain voltage bias in two different environmental conditions: "C"—85° C., 85% relative humidity; "D"—24° C., 100% relative humidity.

| Flux Formulation | Type | Leakage Current "C" (amps) | Leakage Current "D"(amps) |
|---|---|---|---|
| 2% Adipic/water, spray, 20 ml/min | Flux of current invention | (6.55 +– 6.34) E-9 | (6.20 +– 5.11) E-10 |
| 3% Adipic/water, spray 20 ml/min | Flux of current invention | (2.58 +– 1.39) E-9 | (4.80 +– 4.29) E-10 |
| 4% Adipic/water, spray, 20 ml/min | Flux of current invention | (2.04 +– 0.85) E-9 | (1.99 +– 1.35) E-10 |
| PF-1, hand spray | Benchmark flux | (3.73 +– 1.78) E-8 | (1.33 +– 1.99) E-8 |
| 5% Adipic/water, spray, 5 ml/min | Flux of current invention | (3.51 +– .96) E-8 | (2.52 +– 2.37) E-9 |
| 5% Adipic/water, spray, 10 ml/min | Flux of current invention | (5.02 +– 1.48) E-8 | (5.43 +– 5.16) E-9 |
| 5% Adipic/water, spray, 15 ml/min | Flux of current invention | (5.18 +– 1.95) E-8 | (4.44 +– 3.84) E-9 |
| 5% Adipic/water spray, 20 ml/min | Flux of current invention | (5.19 +– 1.48) E-8 | (0.9 +– 1.79) E-6 |
| PF-1, spray | Benchmark flux | (5.09 +– 0.78) E-8 | (4.27 +– 1.32) E-9 |
| Alpha NR300A2 | Commercially available flux | (1.11 +– 0.32) E-6 | (2.49 +– 1.72) E-5 |
| Senju ZR-80 | Commercially available flux | (3.93 +– 0.19) E-5 | (4.19 +– 0.04) E-5 |

Preferably, the lower the leakage current the better, because it reflects less contaminants, is such as hygroscopic residue (i.e. cleaning is unnecessary). Alpha NR300A2 is available from Alpha Metals, New Jersey. Senju ZR-80 is available from Mitsui Comtek located in Saratoga, Calif.

The above test illustrates that the leakage current (the means used to assess reliability of flux residues) measured on the heating flux is comparable with the VOC-based flux currently used as the benchmark, and is many times lower than non-VOC fluxes containing a surfactant. The reduction in leakage current reflects great improvement in product reliability following the teachings of the present invention.

The criterion for reliability is that the leakage current measured in both environments must be equal to or lower than that of PF-1. This is the no-clean flux currently used in production, containing 99% alcohol, or VOC, as the solvent.

The result for heated adipic acid solutions without any surfactants dispersed through an ultrasonic spray nozzle are listed above. Both sets of data satisfied the reliability criteria.

Of the disclosed solutions, preferably a 3–4% adipic acid solution in water is used.

Thus, the present invention discloses an approach of heating a water-based no-clean soldering flux to increase the solubility of the one or more weak organic acids in the solvent. Product reliability is improved by eliminating the surfactant commonly present in conventional water-based fluxes. The high solid content achieved through heating allows reduction in spray volume, which in turn eliminates the need for a surfactant, thus avoiding a high hygroscopic residue after soldering which causes a deterioration in product reliability.

The greatly increased solubility of adipic acid can be utilized without needing carbon dioxide for flux dispersion, which can be accomplished more effectively using a low volume ultrasonic spray system. The mist deposited on the board is insufficient to aggregate to form a large droplet. Thus, there need be no surfactant.

The disclosed method is not limited to spray fluxing alone. Other techniques, such as dip fluxing, wave fluxing and foaming fluxing can utilize the invention disclosed herein.

What is claimed is:

1. A method for delivering a flux formulation without a surfactant for use in the assembly of electronic circuit boards as a no-clean formulation, comprising:

preparing a flux solution having a fluxing agent consisting essentially of:

one or more weak organic acids; and a solvent consisting essentially of water;

the flux solution serving to transport the fluxing agent before deposition thereof upon a soldering site for reliability improvement engendered by a lack of hygroscopic residue and for avoidance of environmental degradation engendered by a lack of volatile organic chemicals (VOC's);

heating the flux solution to create a heated flux solution and to increase the solubility of the one or more organic acids in the solvent, thereby diminishing the proportion of solvent needed to transport an effective amount of the fluxing agent and thereby diminishing hygroscopic residue remaining after soldering; and applying the heated flux solution through a means of dispersion so that the flux solution is dispersed as fine particles.

2. The method of claim 1 wherein the one or more weak organic acids are selected from the group consisting of adipic acid, glutaric acid, succinic acid, manolic acid, and mixtures thereof.

3. The method of claim 1 wherein the solvent consists essentially of deionized water.

4. The method of claim 1 wherein the solvent consists essentially of distilled water.

5. The method of claim 1 wherein the one or more weak organic acids consists of adipic acid having a solid content of up to 62.5% dissolved in water heated up to about 100° C.

6. The method of claim 1 wherein the fluxing agent consists of adipic acid with a concentration of up to 160 grams of adipic acid per 100 milliliters of water at about 100° C.

7. The method of claim 1 wherein the flux solution consists of 2–5% adipic acid in water.

8. The method of claim 1 wherein the step of applying the heated flux solution to a means of dispersion comprises distributing the heated flux solution at a flow rate between 5–50 ml/min.

9. The method of claim 8 wherein the step of applying the heated flux solution comprises dispersing spray having a droplet size between about 10–400 micrometers in diameter.

* * * * *